US012308831B2

(12) United States Patent
Mertens et al.

(10) Patent No.: US 12,308,831 B2
(45) Date of Patent: May 20, 2025

(54) POWER SWITCH HAVING CASCODED TRANSISTORS OF A SAME CONDICTIVITY TYPE, EACH OF THE CASCODED TRANSISTORS HAVING ITS SOURCE TIED TO ITS BODY

(71) Applicant: NXP USA, Inc., Austin, TX (US)

(72) Inventors: Robert Matthew Mertens, Crystal Lake, IL (US); Christopher James Micielli, Clawson, MI (US)

(73) Assignee: NXP USA, Inc., Austin, TX (US)

( * ) Notice: Subject to any disclaimer, the term of this patent is extended or adjusted under 35 U.S.C. 154(b) by 323 days.

(21) Appl. No.: 18/055,679

(22) Filed: Nov. 15, 2022

(65) Prior Publication Data

US 2024/0162899 A1    May 16, 2024

(51) Int. Cl.
H03K 17/10    (2006.01)
H03K 17/567    (2006.01)

(52) U.S. Cl.
CPC ......... *H03K 17/102* (2013.01); *H03K 17/567* (2013.01)

(58) Field of Classification Search
CPC ........... H03K 17/08122; H03K 17/223; H03K 17/102; H03K 17/6872; H03K 17/567; H03K 17/162; H03K 19/20; H03K 19/018528; H03K 5/24; H03K 5/1252; H03K 3/037; H03K 3/356113; G01R 31/40; G05F 1/00; G05F 1/10; G05F 1/12;

(Continued)

(56) References Cited

U.S. PATENT DOCUMENTS 5,245,230 A    9/1993  Ohri et al.
6,822,842 B2   11/2004  Friedrichs et al.
11,056,880 B1*  7/2021  Mathur ................. H02H 9/046
(Continued)

FOREIGN PATENT DOCUMENTS

WO    WO-9812817 A1    3/1998

OTHER PUBLICATIONS

"Field-effect transistor", Wikipedia, Oct. 18, 2022, retrieved from https://en.wikipedia.org/w/index.php?title=Field-effect_transistor&oldid=1116800496 on Mar. 8, 2024.
Annema et al.: "5.5-V I/O in a 2.5-V 0.25-m CMOS Technology," IEEE Journal of Solid-State Circuits, vol. 36, No. 3, Mar. 2001, pp. 528-538.
Annema et al.: "5.5V Tolerant U0 in a 2.5V 0.25~ CMOS Technology," IEEE 2000 Custom Integrated Circuits Conference, pp. 417-420.

(Continued)

*Primary Examiner* — Sean Kayes
*Assistant Examiner* — Nusrat Quddus
(74) *Attorney, Agent, or Firm* — Joanna G. Geld

(57) ABSTRACT

A power switch includes a first transistor having a first current electrode corresponding to an output of the switch, a second transistor having a first current electrode coupled to a second current electrode of the first transistor, and a third transistor having a first current electrode coupled to a second current electrode of the second transistor and a second current electrode coupled to a first power supply voltage terminal which provides a first power supply voltage. The second current electrodes of each of the first, second, and third transistors are body-tied. An analog switch is either couples the second current electrode of the second transistor or a first reference voltage to a control electrode of the second transistor based on a control signal. A voltage selector circuit either couples the second current electrode of the first transistor or the first reference voltage to a control electrode of the first transistor.

20 Claims, 4 Drawing Sheets

(58) Field of Classification Search
CPC ... G05F 1/46; G05F 1/455; G05F 1/45; G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; G05F 1/463; G05F 1/468; G05F 1/461; G05F 1/465; G05F 1/562; G05F 1/565; G05F 1/567; G05F 1/569; G05F 1/571; G05F 1/573; G05F 1/5735; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/158; H02M 3/1588; H02M 2003/1566; H02M 3/1582; H02M 2003/1557; H05B 39/048; B23K 11/24; H04B 2215/069

See application file for complete search history.

(56) References Cited

U.S. PATENT DOCUMENTS

| | | |
|---|---|---|
| 2006/0044071 A1 | 3/2006 | Hairston |
| 2008/0186004 A1 | 8/2008 | Williams |
| 2009/0174480 A1 | 7/2009 | Lee et al. |
| 2009/0261865 A1* | 10/2009 | Pasqualini ..... H03K 19/018521 327/108 |
| 2015/0123640 A1 | 5/2015 | Kondou |
| 2015/0277468 A1 | 10/2015 | Chellamuthu et al. |
| 2021/0409020 A1 | 12/2021 | Singrigowda et al. |

OTHER PUBLICATIONS

Mentze et al.: "A Scalable High-Voltage Output Driver for Low-Voltage CMOS Technologies," IEEE Transactions on Very Large Scale Integration (VLSI) Systems, vol. 14, No. 12, Dec. 2006, pp. 1347-1353.

Renz et al.: "Switch Stacking in Power Management ICs," IEEE Journal of Emerging and Selected Topics in Power Electronics, vol. 9, No. 3, Jun. 2021, pp. 3735-3743.

Serneels et al.: "A High-Voltage Output Driver in a 2.5-V 0.25-/spl mu/m CMOS Technology," IEEE Journal of Solid-State Circuits, vol. 40, No. 3, Mar. 2005, pp. 576-583.

* cited by examiner

| a  OE | a_REFH | a_REFL | Y |
|---|---|---|---|
| X  0 | REFH | REFL | Z |
| 0  1 | VSS | REFL | VSS |
| 1  1 | REFH | Vddio | Vddio |

FIG. 2

| a_REFH | N0.G | N1.G | N2.G |
|---|---|---|---|
| ('0') VSS | REFH | REFH | REFH |
| ('1') REFH | VSS | N1.S | N2.S |

FIG. 3

| a_REFL | P0.G | P1.G | P2.G |
|---|---|---|---|
| ('0') REFL | Vddio | P1.S | P2.S |
| ('1') Vddio | REFL | REFL | REFL |

FIG. 4

POWER SWITCH HAVING CASCODED
TRANSISTORS OF A SAME CONDICTIVITY
TYPE, EACH OF THE CASCODED
TRANSISTORS HAVING ITS SOURCE TIED
TO ITS BODY

BACKGROUND

Field

This disclosure relates generally to integrated circuits, and more specifically, to a cascoded transistor switch usable in an input/output (IO) circuit.

Related Art

The Safe Operating Area (SOA) of a device describes the maximum voltages across any two terminals of the device for the device to maintain reliable operation. In some cases, devices rated for lower voltages (referred to as low voltage or LV devices) are used in products which require high voltage operation. For example, LV devices may be used as IO devices of product which operates with higher voltages. In this situation, there are possibilities that SOA violations occur on the LV devices, which can damage the devices. Also, as technology advances, leakage in the IO devices becomes considerable, making low power design more difficult.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIGS. 2-4 illustrate various truth tables for signals within the IO circuit of FIG. 1, in accordance with one embodiment of the present invention.

DETAILED DESCRIPTION

In one aspect, an NMOS power switch and a PMOS power switch are provided which use low voltage NMOS and PMOS devices, respectively, but are capable at operating in higher voltage power domains. In another aspect, the power switches are designed such that they result in reduced leakage currents. For example, in one embodiment, a power switch includes three switch transistors (implemented as low voltage NMOS or PMOS devices) connected in series to extend the operating voltage beyond that of a single transistor, which may also operate to reduce leakage currents. In one embodiment, a single high voltage supply, a single low voltage supply, and a logic signal is used to bias the switch elements within each power switch. An NMOS power switch and a PMOS power switch can be combined and used to form an IO circuit, in which the IO circuit uses at least three NMOS switch elements and at least three PMOS switch elements.

Figure 1:
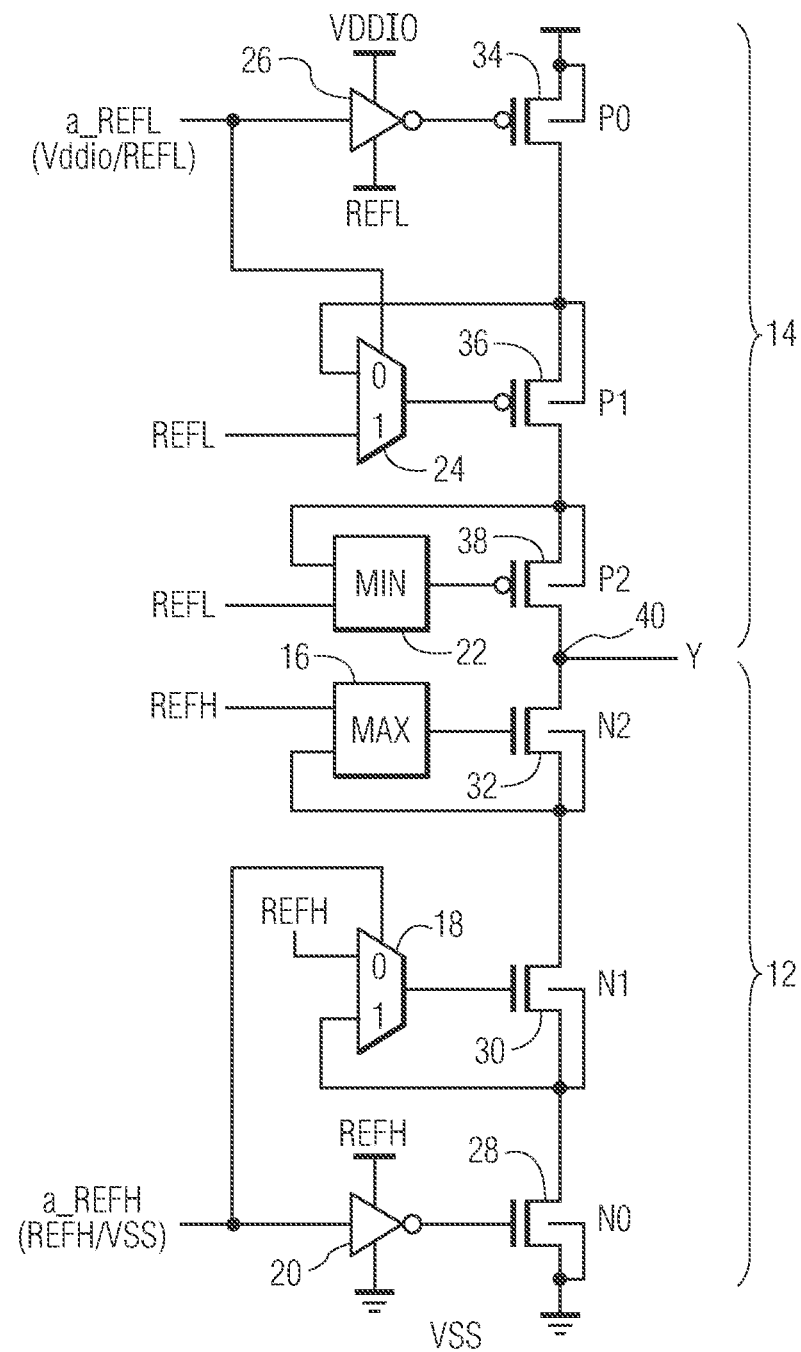
FIG. 1 illustrates, in block diagram form, an IO circuit including an N-channel metal-oxide-semiconductor (NMOS) power switch and a P-channel metal-oxide-semiconductor (PMOS) power switch, in accordance with one embodiment of the present invention.

FIG. 1 illustrates, in block diagram form, an IO circuit 10 including an NNMOS power switch 12 and a PMOS power switch 14, in accordance with one embodiment of the present invention. FIG. 1 includes a first voltage supply terminal configured to provide a first supply voltage (VDDIO), a second voltage supply terminal configured to provide a second supply voltage (VSS) which is less than VDDIO, a third voltage supply terminal configured to provide a third supply voltage (REFL) which is less than VDDIO and greater then VSS, and a fourth voltage supply terminal configured to provide a fourth voltage supply (REFH) which is also less than VDDIO and greater than VSS. In one embodiment, REFH and REFL are high and low reference voltages, respectively, generated from VDDIO and VSS. For ease of description herein, each of the voltage supply terminals may instead be referred to by the provided voltage supply. For example, the first voltage supply terminal may simply be referred to as VDDIO.

In one embodiment, VDDIO is the operating voltage of the device including IO circuit 10, such as, for example, 3.3V, and VSS is 0V (i.e. ground). In one embodiment, REFH is 1.8V while REFL is (3.3-1.8)V=1.5V. However, these are just example values and different embodiments may use different values depending on the design, but the relationship between them remains as VDDIO>REFL>VSS and VDDIO>REFH>VSS. In the illustrated embodiment, REFH and VSS correspond to the logic high (i.e. logic one) and logic low (i.e. logic zero) levels, respectively, for NMOS power switch 12, while VDDIO and REFL correspond to the logic high (i.e. logic one) and logic low (i.e. logic zero) levels, respectively, for PMOS power switch 14. As used herein, the NMOS and PMOS devices may be referred to as NMOS and PMOS transistors, respectively, or they may be referred to as transistors having an N-type conductivity type and a P-type conductivity type, respectively.

In the illustrated embodiment of FIG. 1, NMOS power switch 12 (which may be referred to simply as switch 12) includes an NMOS transistor N0 28, an NMOS transistor N1 30, and an NMOS transistor N2 32, a maximum voltage selector 16, an analog multiplexer (MUX) 18, and an inverter 20. PMOS power switch 14 (which may be referred to simply as switch 14) includes a PMOS transistor P0 34, a PMOS transistor P1 36, and a PMOS transistor P2 38, a minimum voltage selector 22, an analog MUX 24, and an inverter 26. Note that NMOS power switch 12 and PMOS power switch 14 may be referred to as complements to each other, in which NMOS power switch 12 switches between VSS and a high impedance state (Z) at its output node (e.g. Y), and PMOS power switch 14 switches between VDDIO and the high impedance state (Z) at its output node (e.g. Y). As used herein, the NMOS transistors may simply be referred to as transistors N0, N1, and N2, and the PMOS transistors as transistors P0, P1, and P2. Each of maximum voltage selector 16 and minimum voltage selector 22 may be referred to as an extreme voltage selector.

Transistor N2 has a first current electrode (e.g. drain) coupled to a circuit node 40 (also referred to as an output node, referred to as Y, of IO circuit 10), a second current electrode (e.g. source) connected to its body (i.e. tied to its body), and a control electrode (e.g. gate) coupled to receive an output voltage of maximum voltage selector 16. A first input of maximum voltage selector 16 is coupled to receive REFH, and a second input of maximum voltage selector 16 is coupled to the second current electrode of transistor N2.

A first current electrode (e.g. drain) of transistor N1 is coupled to the second current electrode of transistor N2, a second current electrode (e.g. source) of transistor N2 is connected to its body (i.e. tied to its body), and a control electrode (e.g. gate) of transistor N2 is coupled to receive an output of analog MUX 18. A first input of MUX 18 is coupled to the second current electrode of transistor N1, a second input of MUX 18 is coupled to receive REFH, and a control input is coupled to receive an input signal a_REFH (in which a_REFH is a digital signal which toggles between REFH, corresponding to a logic level one, and VSS, corresponding to a logic level zero). MUX 18 is designed such that when the control input is a logic level one, the output of MUX 18 is connected to the first input, and when the control input is a logic level zero, the output of MUX 18 is connected to the second input. A first current electrode (e.g. drain) of transistor N0 is coupled to the second current electrode of transistor N1, a second current electrode (e.g. source) of transistor N0 is connected to its body (i.e. tied to its body) and to VSS, and a control electrode (e.g. gate) of transistor N0 is coupled to receive an output of inverter 20. An input of inverter 20 receives a_REFH, and power terminals of inverter 20 are coupled to REFH and VSS, in which the output of inverter 20 is also a digital signal which toggles between REFH and VSS.

Transistor P2 has a first current electrode (e.g. drain) coupled to circuit node 40, a second current electrode (e.g. source) connected to its body (i.e. tied to its body), and a control electrode (e.g. gate) coupled to receive an output voltage of minimum voltage selector 22. A first input of minimum voltage selector 22 is coupled to receive REFL, and a second input of minimum voltage selector 22 is coupled to the second current electrode of transistor P2. A first current electrode (e.g. drain) of transistor P1 is coupled to the second current electrode of transistor P2, a second current electrode (e.g. source) of transistor P2 is connected to its body (i.e. tied to its body), and a control electrode (e.g. gate) of transistor P2 is coupled to receive an output of analog MUX 24. A first input of MUX 24 is coupled to the second current electrode of transistor P1, a second input of MUX 24 is coupled to receive REFL, and a control input is coupled to receive an input signal a_REFL (in which a_REFL is a digital signal which toggles between VDDIO, corresponding to a logic level one, and REFL, corresponding to a logic level zero). MUX 24 is designed such that when the control input is a logic level one, the output of MUX 24 is connected to the second input, and when the control input is a logic level zero, the output of MUX 24 is connected to the first input. A first current electrode (e.g. drain) of transistor P0 is coupled to the second current electrode of transistor P1, a second current electrode (e.g. source) of transistor P0 is connected to its body (i.e. tied to its body) and to VDDIO, and a control electrode (e.g. gate) of transistor P0 is coupled to receive an output of inverter 26. An input of inverter 26 receives a_REFL, and power terminals of inverter 26 are coupled to VDDIO and REFL, in which the output of inverter 26 is also a digital signal which toggles between VDDIO and REFL.

Operation of IO circuit 10 of FIG. 1 is described in reference to the truth table illustrated in FIG. 2. IO circuit 10 is controlled by two logic inputs, a_REFH and a_REFL, and generates an output signal Y at circuit node 40. For signal, a_REFH, the voltage level of REFH corresponds to a logic level one, while the voltage level of VSS corresponds to a logic level zero. For signal a_REFL, the voltage level of VDDIO corresponds to a logic level one, and the voltage level of REFL corresponds to a logic level zero. For output Y at circuit node 40, the voltage level of VDDIO corresponds to a logic level one, and a voltage level of VSS to a logic level zero. Output Y also takes the value of Z (the high impedance state), indicating that IO circuit 10 is not driving Y, and the output of IO circuit 10 is high impedance. To provide context for usage of IO circuit 10, the truth table of FIG. 2 also includes a set of control signals used to generate a_REFH and a_REFL, in accordance with one embodiment, including a data input signal (a) and an output enable signal (OE), which are listed in the truth table in terms of logic levels (0 for logic level zero, 1 for logic level 1, and X to indicate "don't care" in which the logic state has no impact on the values of a_REFH and a_REFL). The utility of controlling a_REFH and a_REFL through data input signal (a) and OE will be described later.

Continuing with FIG. 2, the truth table of lists three states for IO circuit 10. In the first state, a_REFH is REFH (logic level one) and a_REFL is REFL (logic level zero), which will prevent both NMOS power switch 12 and PMOS power switch 14 from driving output Y, so that it is Z (in the high impedance state). In the second state, a_REFH is VSS (logic level zero) and a_REFL is REFL (logic level zero), which causes only NMOS power switch 12 to drive output Y so that Y is at voltage VSS (logic level zero). In the third state, a_REFH is REFH (logic level one) and REFL is VDDIO (logic level one), which causes only PMOS power switch 14 to drive output Y so that Y is at voltage VDDIO (logic level one). Though not listed in the truth table, a fourth state is possible where a_REFH is VSS (logic level zero) and a_REFL is VDDIO (logic level one), which would cause both NMOS power switch 12 and PMOS power switch 14 to drive output Y, which is not a useful state because it does not generated a well-defined logic state. One of the purposes for using data signal (a) and OE to control a_REFH and a_REFL is to eliminate this fourth state from the truth table so that IO circuit 10 always has a well-defined behavior (i.e. a well-defined output). Thus, a_REFH and a_REFL are generated from signals data input (a) and OE using logic gates and level translator circuits for which many embodiments are possible. In the illustrated embodiment of FIG. 2, the first state occurs when OE is a logic level zero (regardless of the value of data input (a)), the second state occurs when OE is a logic level one and data input (a) is a logic level zero, and the third state occurs when OE is a logic level one and the data input (a) is a logic level one. In this embodiment, the fourth state cannot be accessed.

Operation of IO circuit 10 will be further described in reference to FIGS. 3 and 4 which illustrates voltages or connections to the gates of transistors N0, N1, and N2 (i.e. N0.G, N1.G, and N2.G, respectively, in FIG. 3) and to the gates of transistors P0, P1, and P2 (i.e. P0.G, P1.G, and P2.G, respectively, in FIG. 4). Therefore, referring back to FIG. 1, assuming that OE is disabled (at a logic zero), then a_REFL (provided as REFL, i.e. a logic zero for PMOS power switch 14) at the input of inverter 26 results in VDDIO (i.e. a logic one for PMOS power switch 14) at the output of inverter 26 and thus at the gate of transistor P0. This turns off transistor P0. Similarly, with OE disabled, a_REFH (provided as REFH, i.e. a logic one for NMOS power switch 12) at the input of inverter 20 results in VSS (i.e. a logic zero for NMOS power switch 12) at the output of inverter 20 and thus at the gate of transistor N0. This turns off transistor N0. With both P0 and N0 off, Y is at the high impedance state (Z).

When OE is enabled, though, then considering when data input (a) is received as a logic one, a_REFH is provided as REFH and a_REFL is provided as VDDIO. In this case, with the input of inverter 26 at VDDIO, the output of inverter 26 is REFL (i.e. a logic zero for PMOS power switch 14) which turns on transistor P0. Continuing with this case, a_REFL being at VDDIO selects the REFL input of MUX 24 to provide to the gate of P1, which turns on transistor P1. Because P0 and P1 have been turned on, one input of voltage selector 22 rises and minimum voltage selector 22 selects the other input, REFL, to provide to the gate of transistor P2, which also turns on transistor P2. Therefore, as illustrated in the second row of FIG. 4, with a_REFL provided as VDDIO, each of P0.G, P1.G, and P2.G of switch 14 is at REFL, pulling the voltage at output Y up to VDDIO. In this manner, the data input (a) being a logic one results in Y being a logic one as well (in which Y is provided as VDDIO).

Referring to switch 12 and continuing with this example in which data input (a) is received as a logic one, inverter 20 provides VSS (i.e. a logic zero for NMOS power switch 12) at its output, thus turning off transistor N0. Also in this example, with a_REFH at REFH (i.e. a logic one for NMOS power switch 12), MUX 18 connects the source of transistor N1 (N1.S) to the gate of transistor N1 (N1.G). Because Y is at voltage VDDIO, off-state leakage currents in N2 will elevate the source of N2 (N2.S) above REFH and maximum selector 16 connects the source of transistor N2 (N2.S) to the gate of transistor N2 (N2.G). Therefore, as illustrated in the second row of FIG. 3, with a_REFH provided as REFH, N0.G receives VSS (in which N0.G=N0.S=VSS), N1.G is connected to N1.S, and N2.G is connected to N2.S. In this manner, switch 12 does not pull-down voltage at Y, allowing Y to be pulled up to VDDIO by switch 14.

Operation of IO circuit 10 operates in an complementary manner when OE is enabled and data input (a) is received as a logic zero. In this case, a_REFH is provided as VSS and a_REFL as REFL. As illustrated in the first row FIG. 3, with a_REFH at VSS, switch 12 provides REFH at each gate of transistors N0, N1, and N2 (at N0.G, N1.G, and N2.G, respectively) which results in turning them all on, pulling the voltage at output Y down to VSS. In this manner, the data input (a) being a logic zero results in Y being a logic zero as well. Referring to switch 14 in this case, as illustrated in the first row of FIG. 4, with a_REFL provided as REFL, switch 14 provides VDDIO to P0.G (in which P0.G=P0.S=VDDIO), thus turning off P0, and connects P1.G to P1.S and P2.G to P2.S. In this manner, switch 14 does not pull-up the voltage at Y, allowing Y to be pulled down to VSS by switch 12.

Figure 5:
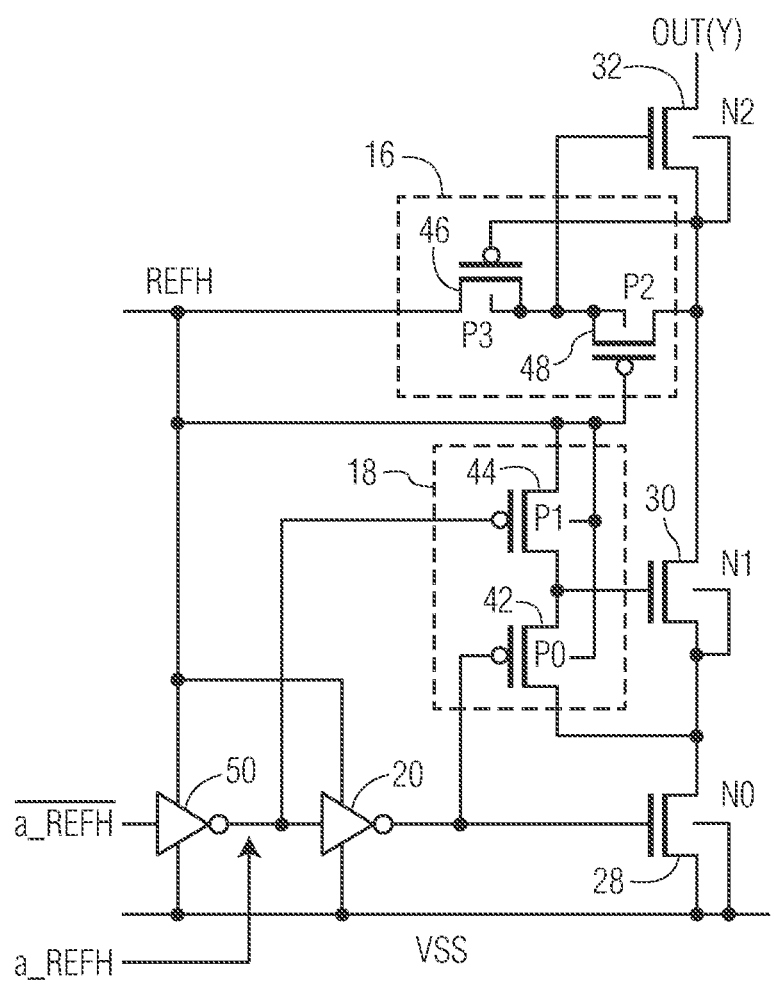
FIG. 5 illustrates, in schematic form, a transistor-level version of the NMOS power switch of FIG. 1, in accordance with one embodiment of the present invention.

FIG. 5 illustrates, in schematic form, a transistor-level version of power switch 12. Analog MUX 18 includes PMOS transistors P0 42 and P1 44, and maximum voltage selector 16 includes PMOS transistors P2 48 and P3 46. Note that in the descriptions which follow for FIG. 5, any mention of transistors P0-P3 refer to the PMOS transistors within switch 12 (e.g. 42, 44, 46, and 48) and not those in switch 14 (e.g. 34, 36, and 38). Switch 12 further includes an inverter 50 having an input coupled to receive the inverse of a_REFH (a_REFH with a bar over it, also referred to as a_REFHb) to generate a_REFH at its output to provide to inverter 20. Inverter 50, like inverter 20, has power terminals coupled to REFH and VSS such that its output is also a digital signal which toggles between REFH and VSS. P0 of MUX 18 has a control electrode (e.g. gate) coupled to the output of inverter 20 (to receive a_REFHb from inverter 50), a first current electrode coupled to the gate of transistor N1, and a second current electrode coupled to the second current electrode (e.g. N1.S) of transistor N1. Transistor P1 of MUX 18 has a control electrode (e.g. gate) coupled to receive a_REFH, a first current electrode coupled to receive REFH, and a second current electrode coupled to the gate of transistor N1. The bodies of each of transistors P0 and P1 of MUX 18 are coupled to REFH as well.

Transistor P2 of maximum voltage selector 16 has a control electrode (e.g. gate) coupled to receive REFH, a first current electrode and body coupled to the control electrode of transistor N2, and a second current electrode coupled to the second current electrode of transistor N2 (e.g. N2.S). Transistor P3 of maximum voltage selector 16 has a control electrode coupled to the second current electrode of transistor N2 (e.g. N2.S), a first current electrode coupled to receive REFH, and a second current electrode and body coupled to the control electrode of transistor N2 (and to the first current electrode of transistor P2 of selector 16).

In operation, MUX 18 controls whether the control electrode of transistor N1 is coupled to REFH or to its second current electrode (N1.S). For MUX 18, a_REFH is the control input of MUX 18 such that when a_REFH is a logic one (REFH), transistor P0 is on and transistor P1 is off, such that N1.G is connected to N1.S via transistor P0, and when a_REFH is a logic zero (VSS), transistor P1 is on and transistor P0 is off, such that N1.G is coupled to receive REFH, as described, for example, in the table of FIG. 3. Maximum voltage selector 16 controls whether the control electrode of transistor N2 is coupled to REFH or to its second control electrode (N2.S). When REFH is greater than N2.S, transistor P3 turns on as transistor P2 turns off such that REFH is provided to N2.G, but when REFH is less than N2.S, transistor P2 turns on as transistor P3 turns off such that N2.S is connected instead to N2.G via transistor P2. That is, when transistors N0 and N1 pull N2.S towards VSS, REFH is greater than N2.S such that transistor P3 drives N2.G to REFH to fully turn on transistor N2.

Figure 6:
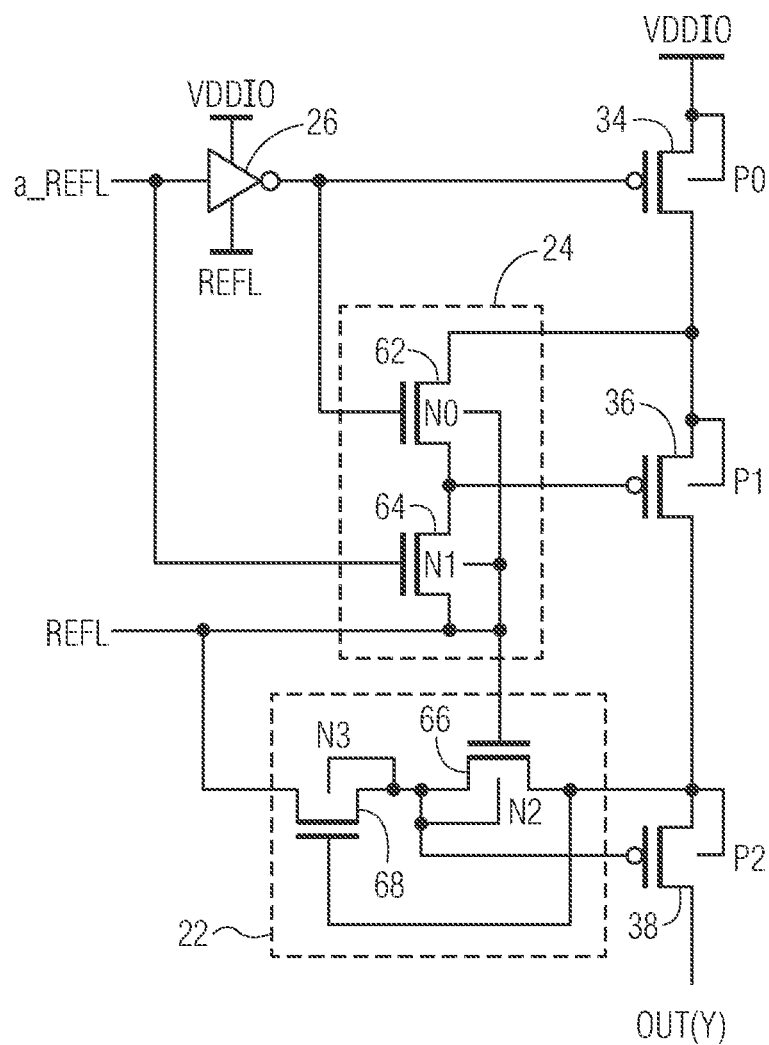
FIG. 6 illustrates, in schematic form, a transistor-level version of the PMOS power switch of FIG. 1, in accordance with one embodiment of the present invention.

FIG. 6 illustrates, in schematic form, a transistor-level version of power switch 14, which operates as the complement of power switch 12. Analog MUX 24 includes NMOS transistors N0 62 and N1 64, and minimum voltage selector 22 includes NMOS transistors N2 66 and N3 68. Note that in the descriptions which follow for FIG. 6, any mention of transistors N0-N3 refer to the NMOS transistors within switch 14 (e.g. 62, 64, 66, and 68) and not those in switch 12 (e.g. 32, 30, and 28). N0 of MUX 24 has a control electrode (e.g. gate) coupled to the output of inverter 26 (to receive a_REFLb, i.e. the inverse of a_REFL, from inverter 26), a first current electrode coupled to the gate of transistor P1, and a second current electrode coupled to the second current electrode (e.g. P1.S) of transistor P1. Transistor N1 of MUX 24 has a control electrode (e.g. gate) coupled to receive a_REFL, a first current electrode coupled to receive REFL, and a second current electrode coupled to the gate of transistor P1. The bodies of each of transistors N0 and N1 of MUX 24 are coupled to REFL as well.

Transistor N2 of minimum voltage selector 22 has a control electrode (e.g. gate) coupled to receive REFL, a first current electrode and body coupled to the control electrode of transistor P2, and a second current electrode coupled to the second current electrode of transistor P2 (e.g. P2.S). Transistor N3 of minimum voltage selector 22 has a control electrode coupled to the second current electrode of transistor P2 (e.g. P2.S), a first current electrode coupled to receive REFL, and a second current electrode and body coupled to the control electrode of transistor P2 (and to the first current electrode of transistor N2 of selector 22).

In operation, MUX 24 controls whether the control electrode of transistor P1 is coupled to REFL or to its second current electrode (P1.S). For MUX 24, a_REFL is the control input of MUX 24 such that when a_REFL is a logic zero (REFL), transistor N0 is on and transistor N1 is off, such that P1.G is connected to P1.S via transistor N0, and when a_REFL is a logic one (VDDIO), transistor N1 is on and transistor N0 is off, such that P1.G is coupled to receive REFL, as described, for example, in the table of FIG. 4. Minimum voltage selector 22 controls whether the control electrode of transistor P2 is coupled to REFL or to its second control electrode (P2.S). When REFL is less than P2.S, transistor N3 turns on as transistor N2 turns off such that REFL is provided to P2.G, but when REFL is greater than P2.S, transistor N2 turns on as transistor N3 turns off such that P2.S is connected instead to P2.G via transistor N2. That is, when transistors P0 and P1 pull P2.S towards VDDIO, REFL is less than P2.S such that transistor N3 drives P2.G to REFL to fully turn on transistor P2.

Referring to switch 12, note that transistors N0/N1/N2 are considered the primary switch devices that selectively connect the corresponding output (OUT) to VSS, and, referring to switch 14, transistors P0/P1/P2 are considered the primary switch devices that selectively connect the corresponding output (OUT) to VDDIO. Referring to IO circuit 10, when OE is enabled (asserted high) and data input (a) is a logic one, a_REFH is provided as REFH and a_REFL as VDDIO, then the source and gate of transistor N1 are connected as are the source and gate of transistor N2. For example, referring to the illustrated embodiment of FIG. 5, in this case, the drain leakage across N0/N1/N2 will pull N2.S to ⅔ of VDDIO, and transistor P2 of maximum voltage selector circuit 16 connects the source and gate of transistor N2. Similarly, when OE is enabled and data input (a) is a logic zero, a_REFH is provided as VSS and a_REFL as REFL, then the source and gate of transistor P1 are connected as are the source and gate of transistor P2. For example, referring to the illustrated embodiment of FIG. 6, in this case, the drain leakage across P0/P1/P2 will pull up P2.S to ⅓ of VDDIO, and transistor N2 of minimum voltage selector circuit 22 connects the source and gate of transistor P2.

As complementary metal oxide semiconductor (CMOS) process continue to advance with decreases in size and voltages, gate-induced drain leakage (GIDL) current becomes increasingly problematic, affecting the expected voltages on the internal nodes (such as those nodes between the primary switch devices). The GIDL, modulated primarily by the drain to gate voltage (VGD), may cause the drain current in a CMOS device to be non-monotonic with the gate to source voltage (VGS). As an example, if, for switch 12, only two NMOS devices, such as N0/N1, were used, with the gate of N1 hard-tied to a reference voltage (e.g. VDD), and with the drain of N1 at "2×VDD," it may be expected that the shared node between N0 and N1 would sit at about the VDD, and both devices would remain off. However, the non-monotonicity of the drain current can cause this shared mid-node to float well above VDD, until N0 begins conducting breakdown current to counteract N1's GIDL leakage current. This may result in reliability issues with cascoded designs. However, by connecting the sources, gates, and bodies of each of N0/N1/N2 (when OE is enabled and data input (a) is a logic one) or of each of P0/P1/P2 (when OE is enabled and data input (a) is a logic zero), the monotonicity of the IV curves can be maintained, resulting in improved reliability. The stacking of three switching devices may also help ensure that the voltage on the output (OUT) is evenly spread over these devices. Further, due to these gate to source connections, even if the primary switching devices are not precisely matched, the internal shared nodes between switching devices can be biased with a reasonable voltage division of the voltage on the output (OUT). Also, in one embodiment, with power switches 12 and 14 of IO circuit 10, note that no device will see excessive gate-to-source voltages, drain-to-source voltages, or gate-to-drain voltages so long as REFH does not exceed the maximum device operating voltage and VDDIO does not exceed three times the maximum device operation voltage.

While the combination of power switches 12 and 14 can be used to form an IO circuit such as IO circuit 10 as illustrated in the embodiment of FIG. 1, each of power switches 12 and 14 can be used in other applications, independently of each other or combined. For example, power switch 12 can operate, as needed, in an application to provide its output at VSS or the high impedance state, and power switch 14 can operate, as needed, in an application to provide its output at VDDIO or the high impedance state. In alternate embodiments, each of analog MUXes 18 and 24 can be implemented differently to bias the gates of N1 and P1, respectively, and may more generally be referred to as analog switches. Also, each of maximum voltage selector 16 (i.e. a higher-of-two circuit) and minimum voltage selector 22 (i.e. a lower-of-two circuit) can be implemented differently to bias the gates of N2 and P2, respectively.

By now it should be appreciated that there has been provided improved power switches for use in an IO circuit, in which each power switch includes at least three cascoded switching devices. In one aspect, an analog switch (e.g. 18 or 24) is used to provide a bias voltage to the gate of the middle cascaded transistor of a power switch, and an extreme voltage selector (e.g. 16 or 22) that includes a transistor (e.g. P2 48 or N2 66) which operates to selectively connect the gate and source of a top cascoded transistor (closest to the output, e.g. N2 21 or P2 38) based on the source voltage of the top cascoded transistor and a corresponding first power supply voltage (e.g. REFH or REFL). A bottom cascaded transistor (furthest from the output, e.g. N0 28 or P0 34)) is coupled between the output and a second power supply voltage (e.g. VSS or VDDIO) and is controlled based on an enable signal (e.g. a_REFH or a_REFL) to either allow the output (e.g. Y) to be connected to the second power supply voltage or disconnect the output (e.g. Y) from the second power supply voltage.

The semiconductor substrate of the devices described herein can be any semiconductor material or combinations of materials, such as gallium arsenide, silicon germanium, silicon-on-insulator (SOI), silicon, monocrystalline silicon, the like, and combinations of the above. In one embodiment, the devices are implemented as finFET devices.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or a "b" following the signal name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the analog switches or MUXs and the voltage selector circuits can be implemented using different circuit elements and layouts to provide the needed functionality. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a power switch includes a first transistor of a first conductivity type having a first current electrode corresponding to an output of the power switch and a second current electrode tied to its body terminal; a second transistor of the first conductivity type having a first current electrode coupled to the second current electrode of the first transistor and a second current electrode tied to its body terminal; a third transistor of the first conductivity type having a first current electrode coupled to the second current electrode of the second transistor and a second current electrode tied to its body terminal and coupled to a first power supply voltage terminal configured to provide a first power supply voltage; an analog switch configured to either couple the second current electrode of the second transistor or a first reference voltage to a control electrode of the second transistor based on a control signal; and a voltage selector circuit configured to either couple the second current electrode of the first transistor or the first reference voltage to a control electrode of the first transistor. In one aspect, the control signal toggles between the first power supply voltage and the first reference voltage and controls a control electrode of the third transistor. In a further aspect, the power switch further includes an inverter having an input coupled to receive the control signal, and an output coupled to the control electrode of the third transistor. In another aspect of the embodiment, the control signal toggles between the first power supply voltage and the first reference voltage, wherein, when the control signal is at the first supply voltage, the analog switch provides the first reference voltage to the control electrode of the second transistor, and, when the control signal is at the first reference voltage, the analog switch couples the second current electrode of the second transistor to the control electrode of the second transistor. In a further aspect, the analog switch includes a first transistor of a second conductivity type, opposite the first conductivity type, having a first current electrode coupled to the control electrode of the second transistor of the first conductivity type, a second current electrode coupled to the second current electrode of the second transistor of the first conductivity type, and a control electrode controlled by an inverse of the control signal, and a second transistor of the second conductivity type having a first current electrode coupled to the control electrode of the second transistor of the first conductivity type, a second current electrode coupled to receive the first reference voltage, and a control electrode controlled by the control signal. In another aspect, the voltage selector circuit is further characterized as an extreme voltage selector which selects a maximum-of-two voltage or a minimum-of-two voltage. In a further aspect, the voltage selector circuit includes a first transistor of a second conductivity type, opposite the first conductivity type, having a first current electrode coupled to a control electrode of the first transistor of the first conductivity type, a second current electrode coupled to the second current electrode of the first transistor of the first conductivity type, and a control electrode coupled to receive the first reference voltage, and a second transistor of the second conductivity type having a first current electrode coupled to the control electrode of the first transistor of the first conductivity type, a second current electrode coupled to receive the first reference voltage, and a control electrode coupled to the second current electrode of the first transistor of the first conductivity type. In yet a further aspect, the control signal toggles between the first power supply voltage and the first reference voltage, wherein, when the control signal is at the first supply voltage, the second transistor of the second conductivity type drives the control electrode of the first transistor of the first conductivity type by providing the first reference voltage to the control electrode of the first transistor of the first conductivity type, and, when the control signal is at the first reference voltage, the first transistor of the second conductivity type couples the second current electrode of the first transistor of the first conductivity type to the control electrode of the first transistor of the first conductivity type. In another further aspect, when the first conductive type is N-type and the second conductivity type is P-type, when the first reference voltage is greater than a voltage at the second current electrode of the first transistor of the first conductivity type, the second transistor of the second conductivity type drives the control electrode of the first transistor of the first conductivity type by providing the first reference voltage to the control electrode of the first transistor of the first conductivity type, and, when the voltage at the second current electrode of the first transistor of the first conductivity type is greater than the first reference voltage, the first transistor of the second conductivity type couples the second current electrode of the first transistor of the first conductivity type to the control electrode of the first transistor of the first conductivity type. In another further aspect, when the first conductive type is P-type and the second conductivity type is N-type, when the first reference voltage is less than a voltage at the second current electrode of the first transistor of the first conductivity type, the second transistor of the second conductivity type drives the control electrode of the first transistor of the first conductivity type by providing the first reference voltage to the control electrode of the first transistor of the first conductivity type, and, when the voltage at the second current electrode of the first transistor of the first conductivity type is less than the first reference voltage, the first transistor of the second conductivity type couples the second current electrode of the first transistor of the first conductivity type to the control electrode of the first transistor of the first conductivity type. In another aspect of the embodiment, the control signal toggles between the first power supply voltage and the first reference voltage, and, when the control signal is at the first power supply voltage, the output of the power switch is pulled to the first power supply voltage, and, when the control signal is at the first reference voltage, the output of the power switch is at a high impedance state. In another aspect of the embodiment, the power switch is in an input/output (IO) circuit, in which the first, second, and third transistors of the power switch are further characterized as NMOS transistors, and the IO circuit further includes a second power switch, and the second power switch includes a first PMOS transistor having a first current electrode corresponding to an output of the second power switch and a second current electrode tied to its body terminal, wherein the output of the second power switch is coupled to the output of the power switch and provides an output of the IO circuit; a second PMOS transistor having a first current electrode coupled to the second current electrode of the first PMOS transistor and a second current electrode tied to its body terminal; a third PMOS transistor having a first current electrode coupled to the second current electrode of the second PMOS transistor and a second current electrode tied to its body terminal and coupled to a second power supply voltage terminal configured to provide a second power supply voltage, greater than the first power supply voltage; an analog switch configured to either couple the second current electrode of the second PMOS transistor or a second reference voltage to a control electrode of the second PMOS transistor based on a second control signal; and a voltage selector circuit configured to either couple the second current electrode of the first PMOS transistor or the second reference voltage to a control electrode of the first PMOS transistor. In a further aspect, the control signal toggles between the first power supply voltage and the first reference voltage, and the second control signal toggles between the second reference voltage and the second power supply voltage. In a further aspect, the second reference voltage greater than the first power supply voltage and less than the second power supply voltage, and the first reference voltage is greater than the first power supply voltage and less than the second power supply voltage.

In another embodiment, a power switch includes a first transistor of a first conductivity type having a first current electrode corresponding to an output of the power switch and a second current electrode tied to its body terminal; a second transistor of the first conductivity type having a first current electrode coupled to the second current electrode of the first transistor and a second current electrode tied to its body terminal; a third transistor of the first conductivity type having a first current electrode coupled to the second current electrode of the second transistor and a second current electrode tied to its body terminal and coupled to a first power supply voltage terminal configured to provide a first power supply voltage; an analog multiplexer (MUX) configured to, based on a control signal, either couple the second current electrode of the second transistor via a first transistor of a second conductivity type to a control electrode of the second transistor or couple a first reference voltage to a control electrode of the second transistor via a second transistor of the second conductivity type, wherein the control signal toggles between the first power supply voltage and the first reference voltage and controls a control electrode of the third transistor; and a voltage selector circuit configured to either couple the second current electrode of the first transistor or the first reference voltage to a control electrode of the first transistor. In one aspect, the voltage selector circuit is configured to select an extreme voltage between the first reference voltage or and a voltage at the second current electrode of the first transistor of the first conductivity type, wherein the extreme voltage is one of a maximum voltage or a minimum voltage. In an other aspect of the another embodiment, the first transistor of the second conductivity type has a first current electrode coupled to the control electrode of the second transistor, a second current electrode coupled to the second current electrode of the second transistor, and a control electrode controlled by an inverse of the control signal, and the second transistor of the second conductivity type has a first current electrode coupled to the control electrode of the second transistor, a second current electrode coupled to receive the first reference voltage, and a control electrode controlled by the first control signal. In yet another aspect, the voltage selector circuit includes a third transistor of the second conductivity type having a first current electrode coupled to a control electrode of the first transistor, a second current electrode coupled to the second current electrode of the first transistor, and a control electrode coupled to receive the first reference voltage, and a fourth transistor of the second conductivity type having a first current electrode coupled to the control electrode of the first transistor, a second current electrode coupled to receive the first reference voltage, and a control electrode coupled to the second current electrode of the first transistor.

In yet another embodiment, an input/output (IO) circuit includes at least three cascoded NMOS transistors coupled between an output of the IO circuit and a first voltage supply terminal configured to provide a first power supply voltage, including a first NMOS transistor having a drain terminal coupled to the output of the IO circuit and a source terminal tied to its body terminal, a second NMOS transistor having a source terminal tied to its body terminal, and a third NMOS transistor having a source terminal tied to its body terminal and to the first power supply voltage terminal; a first analog MUX configured to either couple the source terminal of the second NMOS transistor or a first reference voltage to a gate terminal of the second NMOS transistor based on a first control signal generated from a data input, wherein the IO circuit is configured to provide output data at the output of the IO circuit which matches a logic state of the data input; a first voltage selector circuit configured to either couple the source terminal of the first NMOS transistor or the first reference voltage to a gate terminal of the first NMOS transistor; at least three cascoded PMOS transistors coupled between the output of the IO circuit and a second voltage supply terminal configured to provide a second power supply voltage that is greater than the first power supply voltage, including a first PMOS transistor having a source terminal tied to its body terminal, a second PMOS transistor having a source terminal tied to its body terminal, and a third PMOS transistor having a source terminal tied to its body terminal and to the second power supply voltage; a second analog MUX configured to either couple the source terminal of the second PMOS transistor or a second reference voltage to a gate terminal of the second PMOS transistor based on a second control signal generated from the data input; and a voltage selector circuit configured to either couple the source terminal of the first PMOS transistor or the second reference voltage to a gate terminal of the first PMOS transistor. In one aspect, the first control signal toggles between the first power supply voltage and the first reference voltage and controls a gate terminal of the third NMOS transistor, and the second control signal toggles between the second reference voltage and the second power supply voltage and controls a gate terminal of the third PMOS transistor, and the second reference voltage greater than the first power supply voltage and less than the second power supply voltage, and the first reference voltage is greater than the first power supply voltage less than the second power supply voltage.

What is claimed is:

1. A power switch, comprising:
   a first transistor of a first conductivity type having a first current electrode corresponding to an output of the power switch and a second current electrode tied to a body terminal of the first transistor;
   a second transistor of the first conductivity type having a first current electrode coupled to the second current electrode of the first transistor and a second current electrode tied to a body terminal of the second transistor;
   a third transistor of the first conductivity type having a first current electrode coupled to the second current electrode of the second transistor and a second current electrode tied to a body terminal of the third transistor and coupled to a first power supply voltage terminal configured to provide a first power supply voltage;
   an analog switch configured to either couple the second current electrode of the second transistor or a first reference voltage to a control electrode of the second transistor based on a control signal; and
   a voltage selector circuit configured to either couple the second current electrode of the first transistor or the first reference voltage to a control electrode of the first transistor.

2. The power switch of claim 1, wherein the control signal toggles between the first power supply voltage and the first reference voltage and controls a control electrode of the third transistor.

3. The power switch of claim 2, further comprising an inverter having an input coupled to receive the control signal, and an output coupled to the control electrode of the third transistor.

4. The power switch of claim 1, wherein the control signal toggles between the first power supply voltage and the first reference voltage, wherein:
   when the control signal is at the first supply voltage, the analog switch provides the first reference voltage to the control electrode of the second transistor, and
   when the control signal is at the first reference voltage, the analog switch couples the second current electrode of the second transistor to the control electrode of the second transistor.

5. The power switch of claim 4, wherein the analog switch comprises:
   a first transistor of a second conductivity type, opposite the first conductivity type, having a first current electrode coupled to the control electrode of the second transistor of the first conductivity type, a second current electrode coupled to the second current electrode of the second transistor of the first conductivity type, and a control electrode controlled by an inverse of the control signal, and
   a second transistor of the second conductivity type having a first current electrode coupled to the control electrode of the second transistor of the first conductivity type, a second current electrode coupled to receive the first reference voltage, and a control electrode controlled by the control signal.

6. The power switch of claim 1, wherein the voltage selector circuit is further characterized as an extreme voltage selector which selects a maximum-of-two voltage or a minimum-of-two voltage.

7. The power switch of claim 6, wherein the voltage selector circuit comprises:
   a first transistor of a second conductivity type, opposite the first conductivity type, having a first current electrode coupled to a control electrode of the first transistor of the first conductivity type, a second current electrode coupled to the second current electrode of the first transistor of the first conductivity type, and a control electrode coupled to receive the first reference voltage, and
   a second transistor of the second conductivity type having a first current electrode coupled to the control electrode of the first transistor of the first conductivity type, a second current electrode coupled to receive the first reference voltage, and a control electrode coupled to the second current electrode of the first transistor of the first conductivity type.

8. The power switch of claim 7, wherein the control signal toggles between the first power supply voltage and the first reference voltage, wherein:
   when the control signal is at the first supply voltage, the second transistor of the second conductivity type drives the control electrode of the first transistor of the first conductivity type by providing the first reference voltage to the control electrode of the first transistor of the first conductivity type, and when the control signal is at the first reference voltage, the first transistor of the second conductivity type couples the second current electrode of the first transistor of the first conductivity type to the control electrode of the first transistor of the first conductivity type.

9. The power switch of claim 7, wherein when the first conductive type is N-type and the second conductivity type is P-type:

when the first reference voltage is greater than a voltage at the second current electrode of the first transistor of the first conductivity type, the second transistor of the second conductivity type drives the control electrode of the first transistor of the first conductivity type by providing the first reference voltage to the control electrode of the first transistor of the first conductivity type, and when the voltage at the second current electrode of the first transistor of the first conductivity type is greater than the first reference voltage, the first transistor of the second conductivity type couples the second current electrode of the first transistor of the first conductivity type to the control electrode of the first transistor of the first conductivity type.

10. The power switch of claim 7, wherein when the first conductive type is P-type and the second conductivity type is N-type:

when the first reference voltage is less than a voltage at the second current electrode of the first transistor of the first conductivity type, the second transistor of the second conductivity type drives the control electrode of the first transistor of the first conductivity type by providing the first reference voltage to the control electrode of the first transistor of the first conductivity type, and when the voltage at the second current electrode of the first transistor of the first conductivity type is less than the first reference voltage, the first transistor of the second conductivity type couples the second current electrode of the first transistor of the first conductivity type to the control electrode of the first transistor of the first conductivity type.

11. The power switch of claim 1, wherein the control signal toggles between the first power supply voltage and the first reference voltage, wherein:

when the control signal is at the first power supply voltage, the output of the power switch is pulled to the first power supply voltage, and when the control signal is at the first reference voltage, the output of the power switch is at a high impedance state.

12. An input/output (IO) circuit comprising the power switch of claim 1, wherein the first, second, and third transistors are further characterized as NMOS transistors, and further comprising a second power switch, the second power switch comprising:

a first PMOS transistor having a first current electrode corresponding to an output of the second power switch and a second current electrode tied to a body terminal of the first PMOS transistor, wherein the output of the second power switch is coupled to the output of the power switch and provides an output of the IO circuit;

a second PMOS transistor having a first current electrode coupled to the second current electrode of the first PMOS transistor and a second current electrode tied to a body terminal of the second PMOS transistor;

a third PMOS transistor having a first current electrode coupled to the second current electrode of the second PMOS transistor and a second current electrode tied to a body terminal of the third PMOS transistor and coupled to a second power supply voltage terminal configured to provide a second power supply voltage, greater than the first power supply voltage;

an analog switch configured to either couple the second current electrode of the second PMOS transistor or a second reference voltage to a control electrode of the second PMOS transistor based on a second control signal; and a voltage selector circuit configured to either couple the second current electrode of the first PMOS transistor or the second reference voltage to a control electrode of the first PMOS transistor.

13. The IO circuit of claim 12, wherein the control signal toggles between the first power supply voltage and the first reference voltage, and the second control signal toggles between the second reference voltage and the second power supply voltage.

14. The IO circuit of claim 13, wherein the second reference voltage greater than the first power supply voltage and less than the second power supply voltage, and the first reference voltage is greater than the first power supply voltage and less than the second power supply voltage.

15. A power switch, comprising:

a first transistor of a first conductivity type having a first current electrode corresponding to an output of the power switch and a second current electrode tied to a body terminal of the first transistor;

a second transistor of the first conductivity type having a first current electrode coupled to the second current electrode of the first transistor and a second current electrode tied to a body terminal of the second transistor;

a third transistor of the first conductivity type having a first current electrode coupled to the second current electrode of the second transistor and a second current electrode tied to a body terminal of the third transistor and coupled to a first power supply voltage terminal configured to provide a first power supply voltage;

an analog multiplexer (MUX) configured to, based on a control signal, either couple the second current electrode of the second transistor via a first transistor of a second conductivity type to a control electrode of the second transistor or couple a first reference voltage to a control electrode of the second transistor via a second transistor of the second conductivity type, wherein the control signal toggles between the first power supply voltage and the first reference voltage and controls a control electrode of the third transistor; and a voltage selector circuit configured to either couple the second current electrode of the first transistor or the first reference voltage to a control electrode of the first transistor.

16. The power switch of claim 15, wherein the voltage selector circuit is configured to select an extreme voltage between the first reference voltage or and a voltage at the second current electrode of the first transistor of the first conductivity type, wherein the extreme voltage is one of a maximum voltage or a minimum voltage.

17. The power switch of claim 15, wherein:

the first transistor of the second conductivity type has a first current electrode coupled to the control electrode of the second transistor, a second current electrode coupled to the second current electrode of the second transistor, and a control electrode controlled by an inverse of the control signal, and the second transistor of the second conductivity type has a first current electrode coupled to the control electrode of the second transistor, a second current electrode coupled to receive the first reference voltage, and a control electrode controlled by the first control signal.

18. The power switch of claim 15, wherein the voltage selector circuit comprises:

a third transistor of the second conductivity type having a first current electrode coupled to a control electrode of the first transistor, a second current electrode coupled to the second current electrode of the first transistor, and a control electrode coupled to receive the first reference voltage, and a fourth transistor of the second conductivity type having a first current electrode coupled to the control electrode of the first transistor, a second current electrode coupled to receive the first reference voltage, and a control electrode coupled to the second current electrode of the first transistor.

19. An input/output (IO) circuit, comprising:

at least three cascoded NMOS transistors coupled between an output of the IO circuit and a first voltage supply terminal configured to provide a first power supply voltage, including:

a first NMOS transistor having a drain terminal coupled to the output of the IO circuit and a source terminal tied to a body terminal of the first NMOS transistor, a second NMOS transistor having a source terminal tied to a body terminal of the second NMOS transistor, and a third NMOS transistor having a source terminal tied to a body terminal of the third NMOS transistor and to the first power supply voltage terminal;

a first analog MUX configured to either couple the source terminal of the second NMOS transistor or a first reference voltage to a gate terminal of the second NMOS transistor based on a first control signal generated from a data input, wherein the IO circuit is configured to provide output data at the output of the IO circuit which matches a logic state of the data input;

a first voltage selector circuit configured to either couple the source terminal of the first NMOS transistor or the first reference voltage to a gate terminal of the first NMOS transistor;

at least three cascoded PMOS transistors coupled between the output of the IO circuit and a second voltage supply terminal configured to provide a second power supply voltage that is greater than the first power supply voltage, including:

a first PMOS transistor having a source terminal tied to a body terminal of the first PMOS transistor, a second PMOS transistor having a source terminal tied to a body terminal of the second PMOS transistor, and a third PMOS transistor having a source terminal tied to a body terminal of the third PMOS transistor and to the second power supply voltage;

a second analog MUX configured to either couple the source terminal of the second PMOS transistor or a second reference voltage to a gate terminal of the second PMOS transistor based on a second control signal generated from the data input; and a second voltage selector circuit configured to either couple the source terminal of the first PMOS transistor or the second reference voltage to a gate terminal of the first PMOS transistor.

20. The IO circuit of claim 19, wherein:

the first control signal toggles between the first power supply voltage and the first reference voltage and controls a gate terminal of the third NMOS transistor, and the second control signal toggles between the second reference voltage and the second power supply voltage and controls a gate terminal of the third PMOS transistor, and the second reference voltage greater than the first power supply voltage and less than the second power supply voltage, and the first reference voltage is greater than the first power supply voltage less than the second power supply voltage.

* * * * *